United States Patent [19]
Hayashi

[11] Patent Number: 5,331,170
[45] Date of Patent: Jul. 19, 1994

[54] STATIC TYPE RANDOM ACCESS MEMORY DEVICE WITH STACKED MEMORY CELL FREE FROM PARASITIC DIODE

[75] Inventor: Fumihiko Hayashi, Tokyo, Japan

[73] Assignee: Nec Corporation, Tokyo, Japan

[21] Appl. No.: 858,572

[22] Filed: Mar. 27, 1992

[30] Foreign Application Priority Data

Mar. 28, 1991 [JP] Japan .................................. 3-64218

[51] Int. Cl.⁵ .......................................... H01L 27/11
[52] U.S. Cl. .................... 257/377; 257/388; 257/393; 257/413; 257/903
[58] Field of Search ............... 257/903, 377, 388, 412, 257/413

[56] References Cited
U.S. PATENT DOCUMENTS 4,814,841 3/1989 Masuoka et al. ...................... 257/69
5,194,749 3/1993 Meguro et al. ...................... 257/903
5,210,429 5/1993 Adan .................................. 257/903

Primary Examiner—Robert Limanek
Attorney, Agent, or Firm—Sughrue, Mion, Zinn, Macpeak & Seas

[57] ABSTRACT

A static type random access memory cell comprises two n-channel type driver transistors formed in a major surface portion of a p-type silicon substrate, two n-channel type transfer transistors formed in the major surface portion of the p-type silicon substrate, and two p-channel type load transistors stacked over the n-channel type driver transistors, and heavily doped n-type polysilicon gate electrodes of the n-channel type driver transistors are electrically connected with p-type polysilicon gate electrodes of the p-channel type load transistors, respectively, wherein metal films are inserted between the n-type polysilicon gate electrodes and the p-type polysilicon gate electrodes so that any undesirable diode never take place therebetween.

6 Claims, 13 Drawing Sheets

STATIC TYPE RANDOM ACCESS MEMORY DEVICE WITH STACKED MEMORY CELL FREE FROM PARASITIC DIODE

FIELD OF THE INVENTION

This invention relates to a static type random access memory device and, more particularly, to the structure of a static random access memory device with stacked component transistors.

DESCRIPTION OF THE RELATED ART

A static type random access memory device has been increased in memory capacity at high rate, and 4 megabit static type random access memory devices and 16 megabit static type random access memory devices are developed by semiconductor manufacturers. However, if the semiconductor chip is enlarged together with the memory capacity, the large-sized semiconductor chip increases the production cost, and tends to decrease the production yield. Therefore, it is important for the manufacturer to increase the memory capacity without enlarging the semiconductor chip. In order to achieve the goal, the manufacturer tries to minimize each occupation area assigned to a single memory cell.

FIG. 1 shows a typical example of the prior art static type memory cell fabricated on the minimized occupation area, and the prior art static type memory cell is referred to as "four transistor cell". The static type memory cell shown in FIG. 1 comprise one series combination of a resistor R1 and an n-channel enhancement type driver transistor Q1 coupled between a power voltage line Vdd and a ground voltage line GND, and another series combination of a resistor R2 and an n-channel enhancement type driver transistor Q2 coupled in parallel to the one series combination. Two memory nodes N1 and N2 are provided between the resistors R1 and R2 and the n-channel enhancement type driver transistors Q1 and Q2, respectively, and the memory nodes N1 and N2 are respectively coupled with the gate electrodes of the n-channel enhancement type driver transistors Q2 and Q1. A data bit is stored in the form of differential voltage level between the memory nodes N1 and N2.

The prior art static type memory cell further comprises two n-channel enhancement type transfer transistors Q3 and Q4 which are coupled between digit lines DLa and DLb and the memory nodes N1 and N2, respectively. The n-channel enhancement type transfer transistors Q3 and Q4 are concurrently gated by a word line WL1, and a active high voltage level on the word line WL1 allows the n-channel enhancement type transfer transistors Q3 and Q4 to turn on. A data bit is written into or read out from the memory cell, and current passing through the memory nodes N1 and N2 maintains the data bit. The current used for maintenance of the data bit is called as "standby current".

The prior art static type random access memory cell thus arranged is desirable for reduction of the occupation area. However, if a 4 megabit memory cell array is implemented by the four-transistor type random access memory cells shown in FIG. 1, the standby current for each memory cell is decreased to not greater than 1 microampere, and the resistors R1 and R2 are expected to decrease current passing therethrough not greater than 0.25 picoampere. However, such extremely large resistance decreases the margin between the standby current and leakage current from the memory nodes N1 and N2, and the data bit stored between the memory nodes N1 and N2 is much liable to be inverted due to, for example, alpha particle.

In order to enhance the reliability of the data bit stored between the memory nodes N1 and N2, another static type random access memory cell shown in FIG. 2 is used for a memory cell array. The static type random access memory cell shown in FIG. 2 comprises a series combination of a p-channel enhancement type load transistor Q5 and an n-channel enhancement type driver transistor Q6 coupled between a power voltage line Vdd and a ground voltage line GND, and another series combination of a p-channel enhancement type load transistor Q7 and an n-channel enhancement type driver transistor Q8 coupled in parallel to the other series combination, and memory nodes N3 and N4 are provided between the p-channel enhancement type load transistors Q5 and Q7 and the n-channel enhancement type driver transistors Q6 and Q8, respectively. The prior art static type random access memory cell further comprises n-channel enhancement type transfer transistors Q9 and Q10 coupled between digit lines DLc and DLd and the memory nodes N3 and N4. The n-channel enhancement type transfer transistors Q9 and Q10 are concurrently gated by a word line WL2, and a data bit i the form of differential voltage is transferred between the digit lines DLc and DLd and the memory nodes N3 and N4. The static type random access memory cell thus arranged is implemented by the six component transistors, and is referred to as "six transistor cell".

Since the p-channel enhancement type load transistors Q5 and Q7 compensate the leakage current at the memory nodes N3 and N4, and the standby current is determined by the off-current of the p-channel enhancement type load transistors Q5 and Q7. The on-current of each p-channel enhancement type field effect transistor Q5 or Q7 is large enough to compensate the leakage current at the associated memory node N3 or N4, and is increased upon rapid decay at the memory nodes N3 and N4. For this reason, the six transistor type memory cell is effective against alpha particle. However, the six transistor type memory cell occupies real estate 1.5 to 2 times larger than that of the four transistor type memory cell in so far as the component transistors Q5 to Q10 are two-dimensionally arranged.

In order to decrease the occupation area of the six transistor type memory cell, it is proposed to stack the p-channel enhancement type load transistors Q5 and Q7 over the n-channel enhancement type driver transistors Q6 and Q8.

FIG. 3 shows the layout of the stacked type memory cell, and inter-level insulating films and an aluminum wiring strip AL are deleted from FIG. 3 for clearness of the layout. FIG. 4 shows the structure of the stacked type memory cell taken along line A—A of FIG. 3. The prior art stacked type memory cell is fabricated on a p-type silicon substrate 1, and active areas are defined by a thick field oxide film 1a selectively grown on the p-type silicon substrate 1. N-type impurity regions are formed in the p-type silicon substrate 1, and the n-type impurity regions serve as source and drain regions of the n-channel enhancement type field effect transistors Q6, Q8, Q9 and Q10. However, only one n-type impurity region 1b is shown in FIG. 4 as a drain region of the n-channel enhancement type driver transistor Q6. The active areas are covered with thin gate oxide films 1c, and the gate electrode 3a of the n-channel enhancement type driver transistor Q8 is held in contact with the n-type impurity region 1b or the drain region of the n-channel enhancement type driver transistor Q6. A first inter-level insulating film 4 covers the gate electrode 3a of the n-channel enhancement type driver transistor Q8 as well as the gate electrode 3b of the n-channel enhancement type driver transistors Q6. Contact holes 5a and 5b are formed in the inter-level insulating film 4, and exposes the gate electrodes 3a and 3b, respectively. N-type doped polysilicon strips 6a and 6b respectively pass through the contact holes 5a and 5b, and serve as the gate electrodes of the p-channel enhancement type load transistors Q5 and Q7, respectively. A thin gate oxide film 7 covers the n-type doped polysilicon strips 6a and 6b, and polysilicon strips 8a and 8b extend over the thin gate oxide film 7. The polysilicon film 8a provides the p-type drain region 8aa, the lightly doped n-type channel region 8ab and the p-type source region 8ac for the p-channel enhancement type load transistor Q5. Similarly, the polysilicon film 8b provides the p-type drain region 8ba, the lightly doped n-type channel region 8bb and the p-type source region 8bc for the p-channel enhancement type load transistor Q7. A second inter-level insulating film 9 covers the polysilicon strips 8a and 8b, and the aluminum wiring AL extends over the second inter-level insulating film 9.

The multi-layer structure shown in FIGS. 3 and 4 are fabricated through a process sequence shown in FIGS. 5 to 9. The process sequence starts with preparation of the p-type silicon substrate 1, and the thick field oxide film 1a is selectively grown through a selectively oxidation process such as the LOCOS techniques. Channel doping is carried out through ion-implantation of boron atoms for the n-channel enhancement type field effect transistors Q6, Q8, Q9 and Q10, and silicon oxide is grown to thickness of 5 to 100 nano-meters on the exposed surface of the p-type silicon substrate 1 so as to form the thin gate oxide films 1c. Contact holes 1d are formed in the thin gate oxide films 1c, and tungsten polycide film is deposited to thickness of 200 to 500 nano-meters over the entire surface of the structure. The tungsten polycide film is held in contact through the contact holes 1d, and is etched and patterned to form the gate electrodes 3a and 3b. Arsenic atoms are ion-implanted into the p-type silicon substrate 1 at dose of $10^{15}/cm^2$ to $10^{16}/cm^2$, and is annealed in nitrogen ambience. Then, the source and drain regions 1b are formed in the p-type silicon substrate 1.

Subsequently, silicon dioxide is deposited to thickness of 50 to 500 nano-meters over the entire surface of the structure by using LPCVD process, and the silicon dioxide film thus deposited serves as the inter-level insulating film 4. The contact holes 5a and 5b are formed in the inter-level insulating film 4 through lithographic techniques. The resultant structure of this stage is illustrated in FIG. 5.

After the formation of the contact holes 5a and 5b in the inter-level insulating film 4, polysilicon is deposited to thickness of 100 to 200 nano-meters over the entire surface of the structure by using the LPCVD process, and the polysilicon film 6 thus deposited is held in contact with the gate electrodes 3a and 3b through the contact holes 5a and 5b. The resultant structure of this stage is illustrated in FIG. 6.

N-type impurity atoms are ion-implanted into the polysilicon film 6 at dose of $10^{19}/cm^2$ to $10^{20}/cm^2$ or, alternatively diffused from an appropriate source, and the polysilicon film 6 doped with the n-type impurity atoms is etched and patterned by using lithographic techniques. Then, the n-type polysilicon strips 6a and 6b are left on the inter-level insulating film 4 as shown in FIG. 7.

Silicon oxide is deposited to thickness of 20 to 80 nano-meters over the entire surface of the structure by using the LPCVD process, and the silicon oxide film provides the gate oxide film 7. The gate oxide film 7 is partially removed through lithographic techniques so as to expose parts of the n-type polysilicon strips 6a and 6b. Polysilicon is deposited over the entire surface of the structure again, and the polysilicon film 8 thus deposited is held in contact with the n-type polysilicon strips 6a and 6b. The resultant structure of this stage is illustrated in FIG. 8.

Phosphorus atoms are ion-implanted into the polysilicon film 8 at dose of $10^{12}/cm^2$ to $10^{13}/cm^2$, and the polysilicon film 8 is patterned into the polysilicon strips 8a and 8b. An appropriate mask layer 21 is provided over the channel regions 8ab and 8bb, and boron atoms are ion-implanted into the polysilicon strips 8a and 8b at dose of $10^{15}/cm^2$ to $10^{16}/cm^2$. Then, the source and drain regions 8aa, 8ba, 8ac and 8bc are formed in the polysilicon strips 8a and 8b as shown in FIG. 9.

After the formation of the source and drain regions, phosphosilicate glass containing phosphorus at 4 mol % is deposited to thickness of 100 to 1000 nano-meters over the entire surface of the structure, and the phosphosilicate glass film serves as the second inter-level insulating film 9.

Finally, silicon-containing aluminum is deposited over the entire surface of the structure, and is patterned into the aluminum wiring AL. The resultant structure is previously illustrated in FIGS. 3 and 4.

The stacked type memory cell thus fabricated not only occupies a small amount of real estate but also is stable in view of data storage. However, a problem is encountered in the stacked type memory cell shown in FIGS. 3 and 4 in that the conductivity of the polysilicon strips 3a and 3b is limited to n-type only. In general, p-type polysilicon strips are desirable for the gate electrodes of the p-channel enhancement type load transistors Q5 and Q7 because of controllability of the threshold level and of restriction of short channel effect. However, if the gate electrodes of the p-channel enhancement type load transistors Q5 and Q7 are doped with p-type impurities, the n-type impurities of the gate electrodes 3a and 3b are diffused into the p-type polysilicon strips, and undesirable diodes take place between the gate electrodes 3a and 3b and the p-type polysilicon strips. When negatively biased, the undesirable diodes cause the p-type gate electrodes to unintentionally enter floating state.

SUMMARY OF THE INVENTION

It is therefore an important object of the present invention to provide a static type random access memory device which is free from the problems inherent in the prior art stacked type memory cell.

It is also an important object of the present invention to provide a process of fabricating the static random access memory device which is free from the problems inherent in the prior art stacked type memory cell.

To accomplish the object, the present invention proposes to insert a metal film between a gate electrode of a driver transistor and a gate electrode of a load transistor.

In accordance with one aspect of the present invention, there is provided a static type random access memory device fabricated on a single semiconductor substrate, comprising a plurality of memory cells each having a series combination of a first enhancement type load transistor with a first channel conductivity type, a first memory node and a second enhancement type driver transistor with a second channel conductivity type opposite to the first channel conductivity type coupled between first and second sources of voltage level different in voltage level, a series combination of a third enhancement type load transistor with the first channel conductivity type, a second memory node and a fourth enhancement type driver transistor with the second channel conductivity type coupled between the first and second sources of voltage level, and fifth and sixth enhancement type transfer transistors coupled between the first and second memory nodes and a pair of digit lines, respectively, the first enhancement type load transistor and the fourth enhancement type driver transistor having respective gate electrodes coupled with the first memory node, the third enhancement type load transistor and the second enhancement type driver transistor having respective gate electrodes coupled with the second memory node, the gate electrode of each of the second and fourth enhancement type driver transistors being held in contact with one of the second and first memory nodes formed in a surface portion of the single semiconductor substrate and extending over an insulating film covering a major surface of the single semiconductor substrate, the gate electrode of the aforesaid each of the second and fourth enhancement type driver transistors being covered with a first inter-level insulating film having a contact hole exposing a part of the gate electrode of the foresaid each of the second and fourth enhancement type driver transistors, the part of the gate electrode being covered with a metal film, the gate electrode of each of the first and third enhancement type load transistors being held in contact with the metal film and having a first conductivity type opposite to a second conductivity type of the gate electrode of the aforesaid each of the second and fourth enhancement type driver transistors.

In accordance with another aspect of the present invention, there is provided a process of fabricating a static type random access memory device comprising, the steps of: a) preparing a semiconductor substrate of a first conductivity type; b) forming source and drain regions with a second conductivity type of a pair of enhancement type driver transistors with a second channel conductivity type and a pair of enhancement type transfer transistors with the second channel conductivity type in a surface portion of the semiconductor substrate, the second conductivity type and the second channel conductivity type being opposite to the first conductivity type as well as a first channel conductivity type; c) covering the surface portion of the semiconductor substrate with an insulating film; d) forming gate electrodes of the pair of enhancement type driver transistors, the gate electrode of one of the pair of enhancement type driver transistors being held in contact through the insulating film with the drain region of the other of the pair of enhancement type driver transistors, the gate electrodes of the pair of enhancement type driver transistors having the second conductivity type; e) covering the gate electrodes of the pair of enhancement type driver transistors with a first inter-level insulating film; f) forming contact holes respectively exposing parts of the gate electrodes of the pair of enhancement type driver transistors in the first inter-level insulating film; g) forming metal films in the contact holes, respectively, for respectively covering the parts of the gate electrodes; h) forming gate electrodes of a pair of enhancement type load transistors of the first channel conductivity type on the first inter-level insulating film in such a manner as to be held in contact with the metal films, respectively, the gate electrodes of the pair of enhancement type load transistors having the first conductivity type; and i) completing the pair of enhancement type load transistors.

BRIEF DESCRIPTION OF THE DRAWINGS

The feature and advantages of the static type random access memory cell according to the present invention will be more clearly understood from the following description taken in conjunction with the accompanying drawings in which.

DESCRIPTION OF THE PREFERRED EMBODIMENTS

First Embodiment

Figure 1:
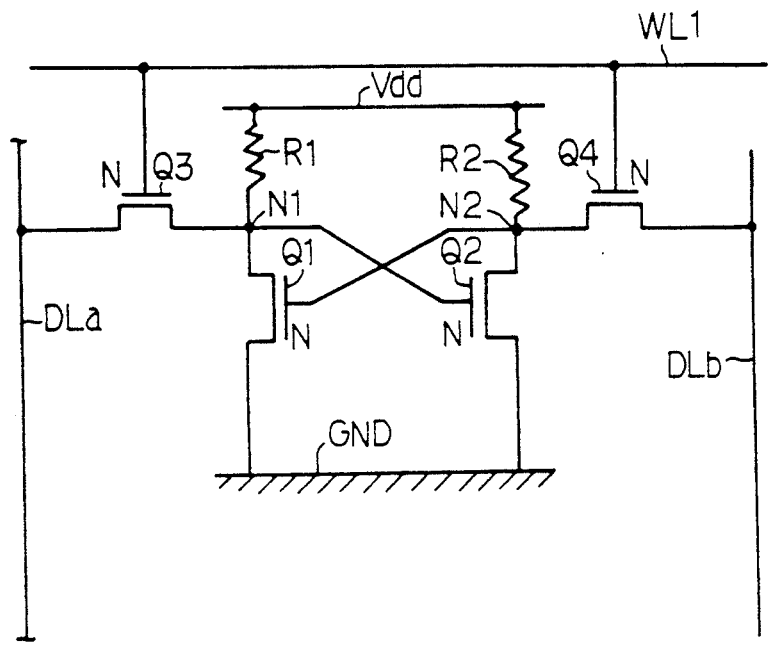
FIG. 1 is a circuit diagram showing the arrangement of the prior art four transistor type static random access memory cell.
Figure 2:
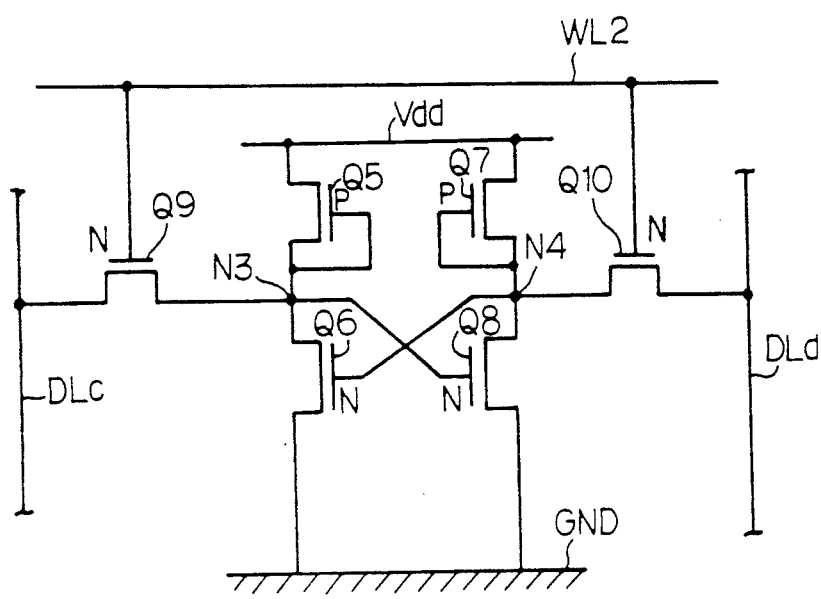
FIG. 2 is a circuit diagram showing the arrangement of the prior art six transistor type static random access memory cell.
Figure 3:
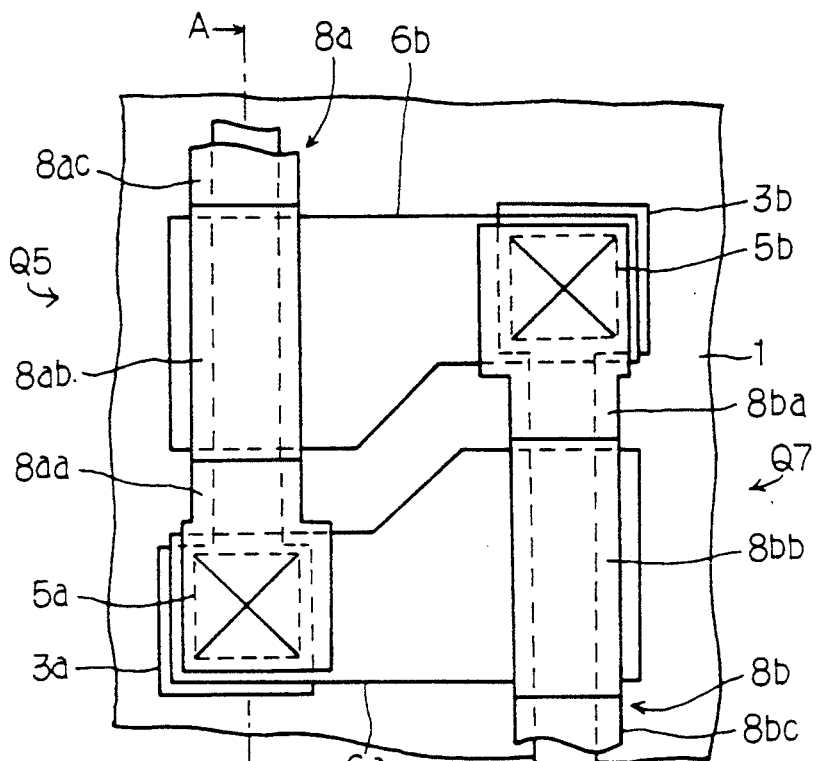
FIG. 3 is a plan view showing the layout of the prior art stacked type static random access memory cell.
Figure 4:
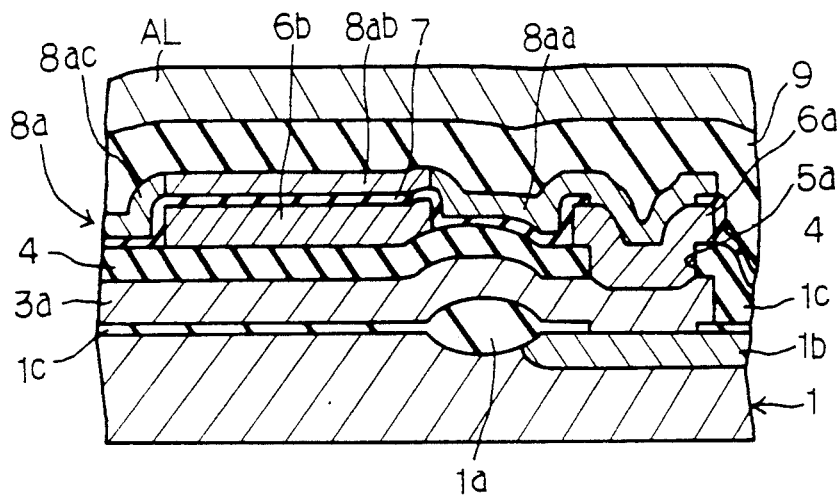
FIG. 4 is a cross sectional view taken along line A—A of FIG. 3 and showing the structure of the stacked type static random access memory cell.
Figure 5:
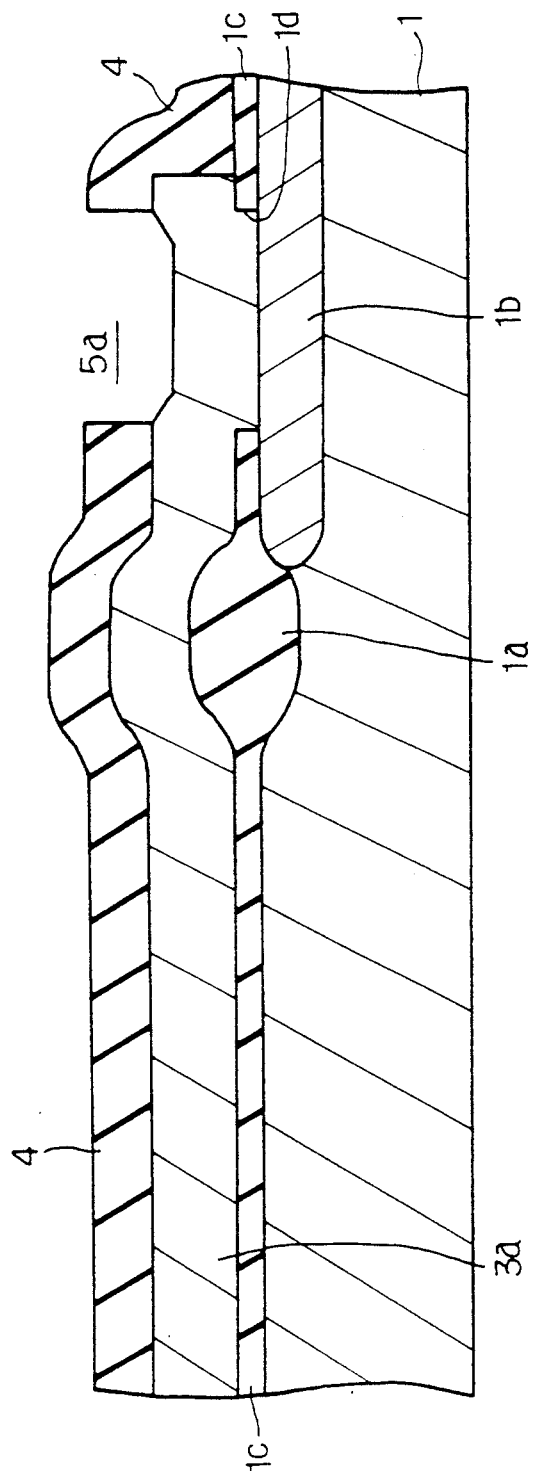
FIGS. 5 to 9 are cross sectional views showing the prior art process sequence of the stacked type static random access memory cell.
Figure 6:
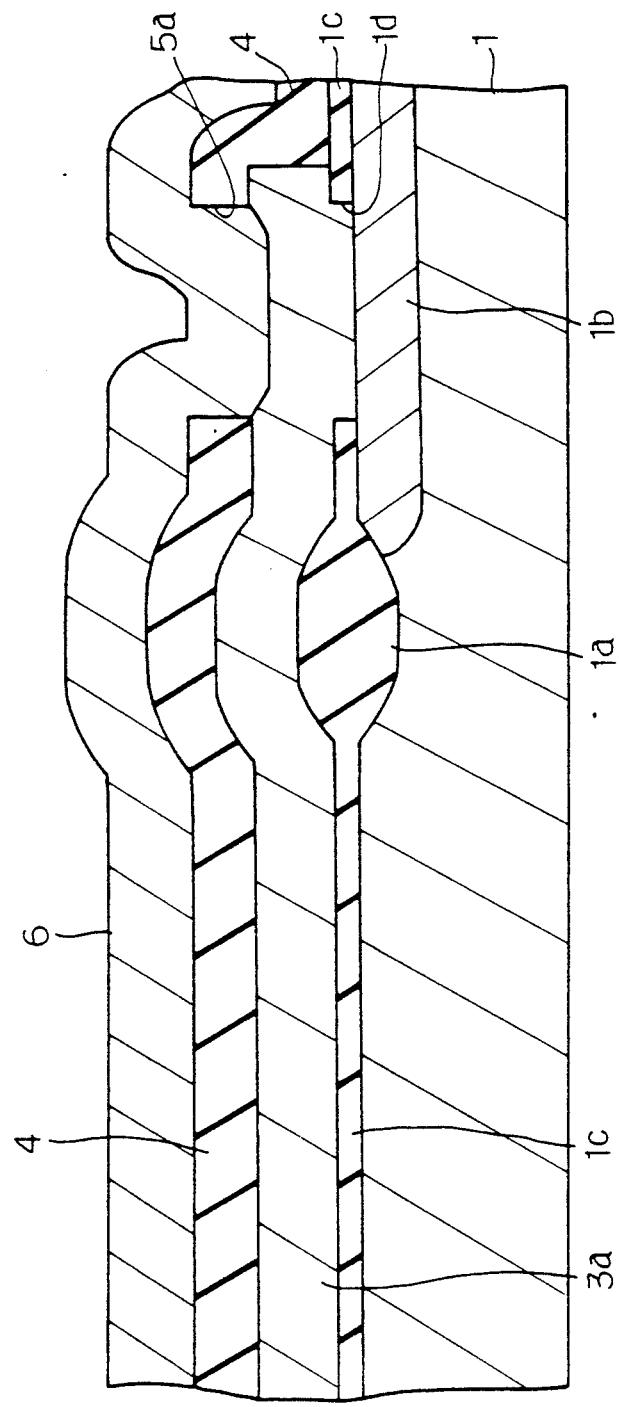
Figure 7:
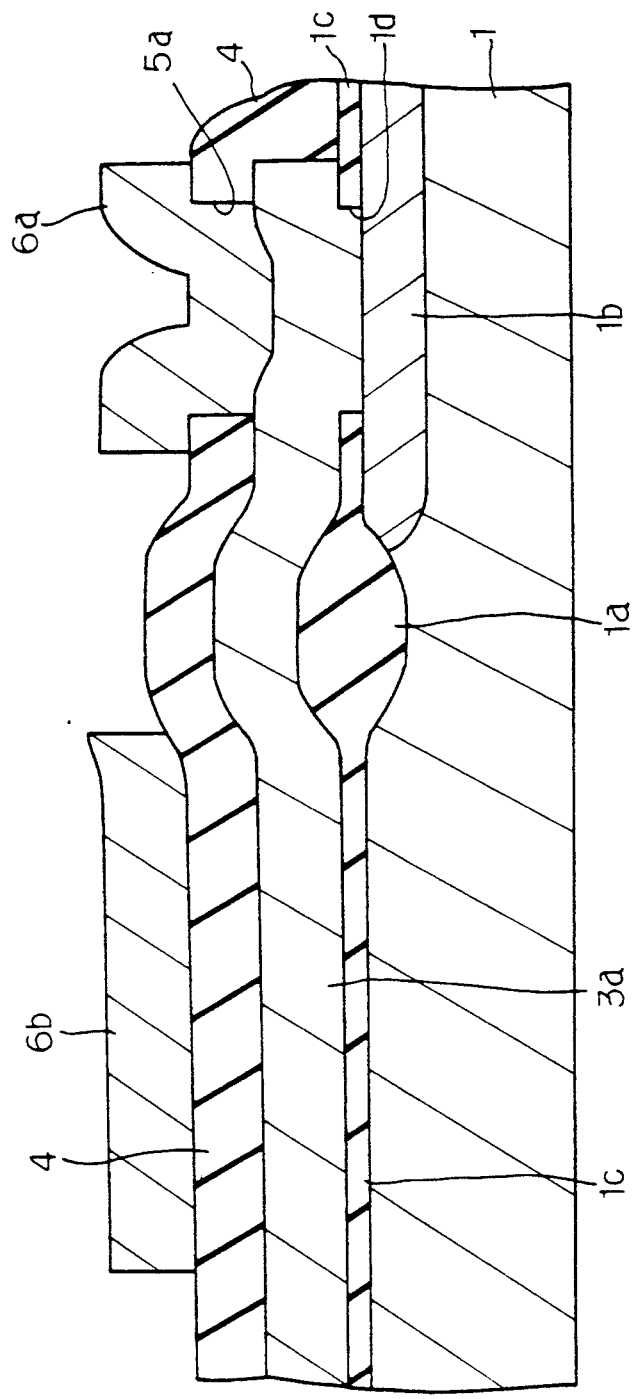
Figure 8:
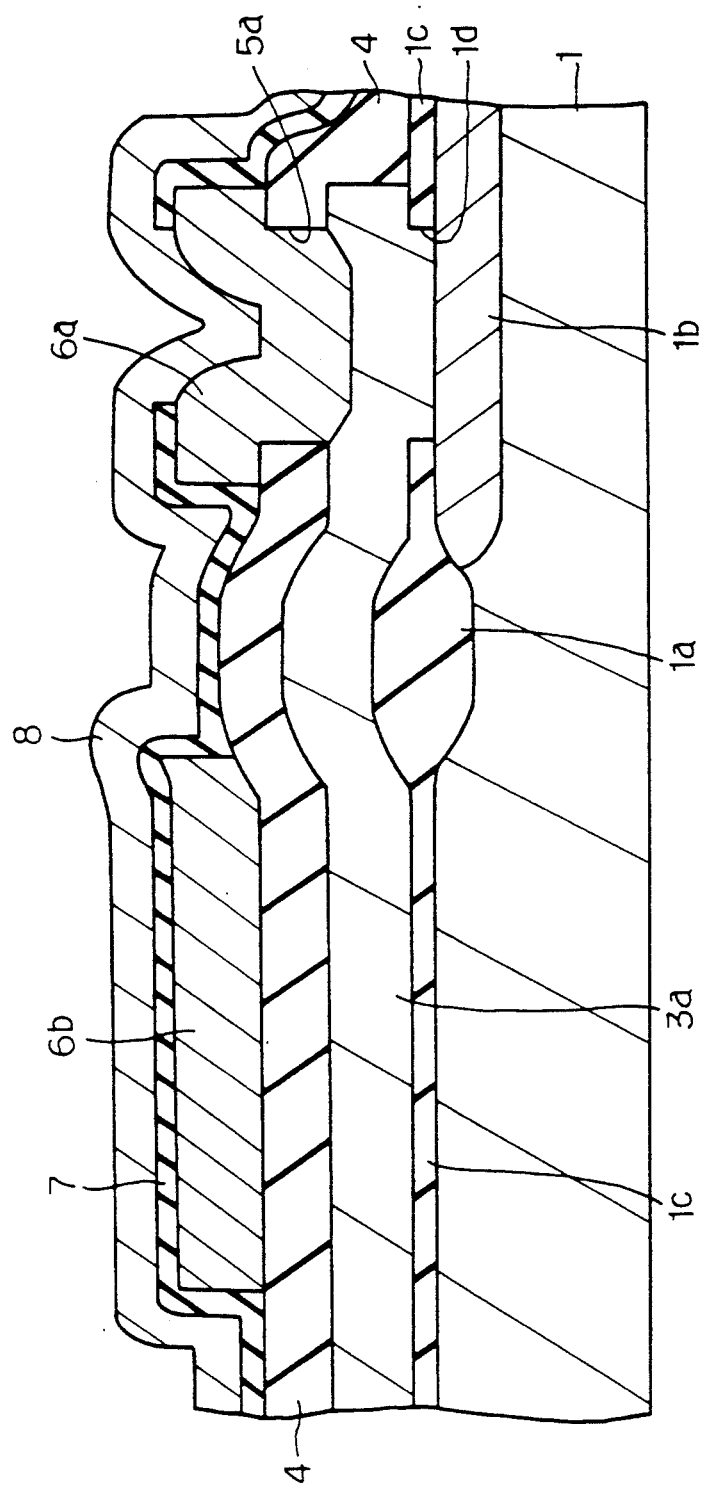
Figure 9:
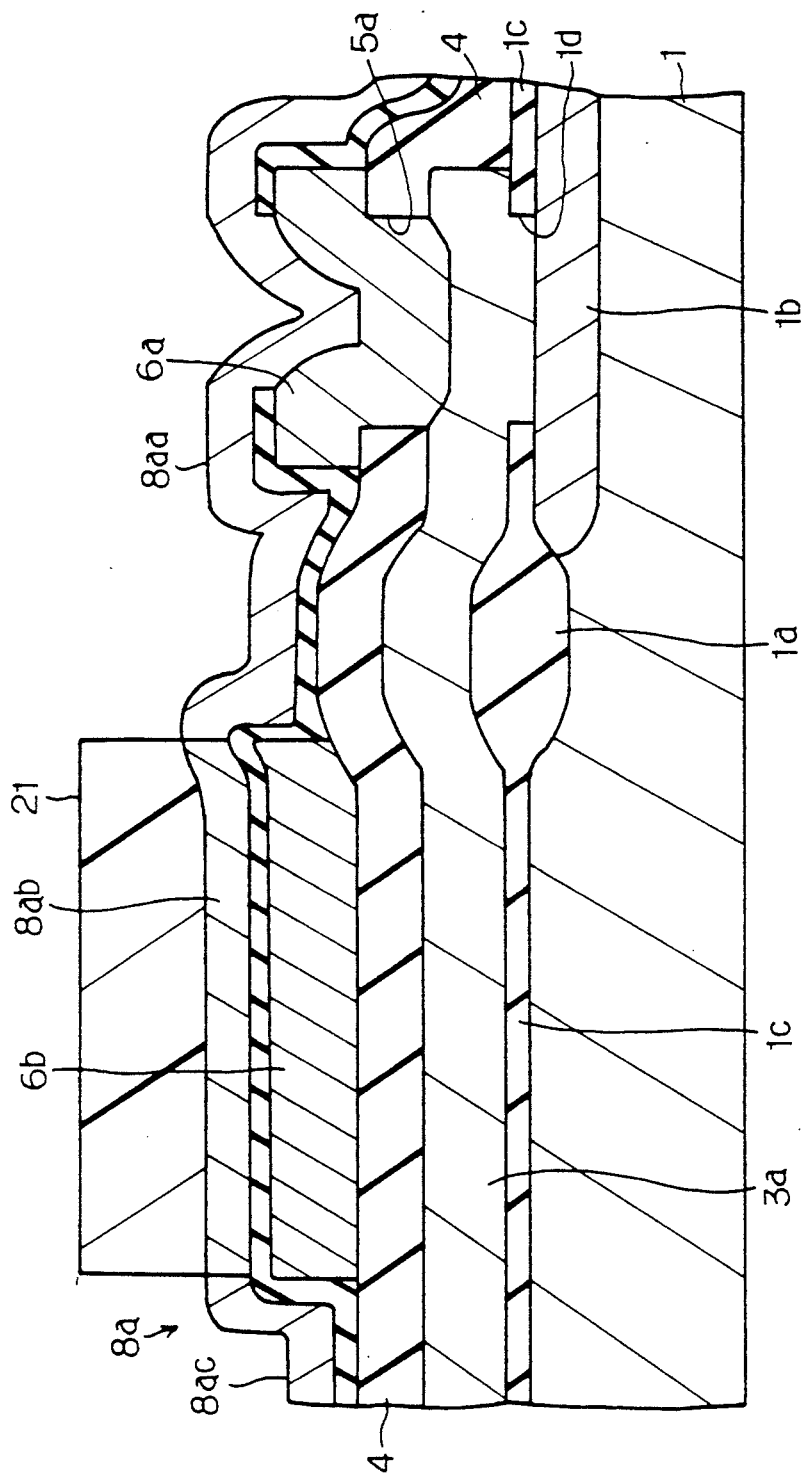
Figure 10:
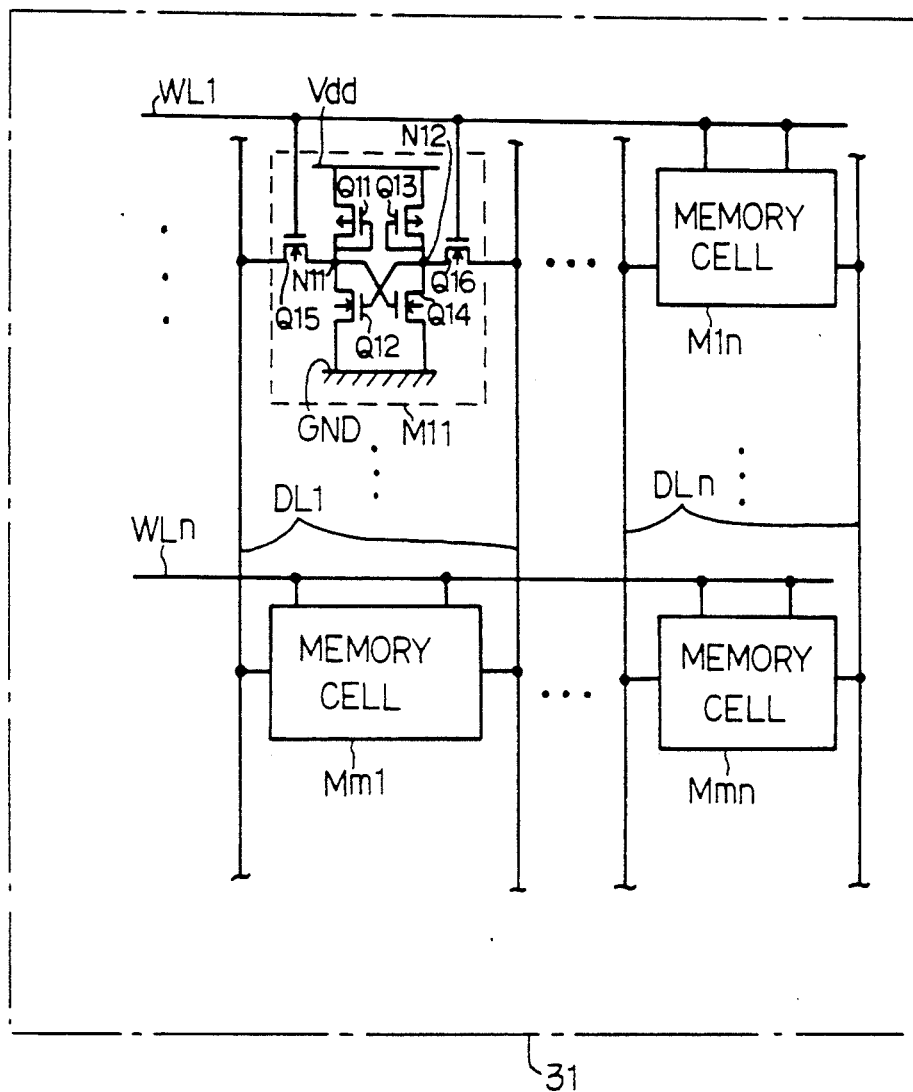
FIG. 10 is a diagram showing the memory cell array incorporated in a static type random access memory device according to the present invention.

Referring to FIG. 10 of the drawings, a static type random access memory device embodying the present invention is fabricated on a single silicon substrate 31, and comprises a memory cell array implemented by a plurality of stacked type memory cells M11, M1n, Mm1 and Mmn. The columns of the memory cell array are respectively associated with a plurality of digit line pairs DL1 to DLn, and the rows of the memory cell array are associated with a plurality of word lines WL1 to WLm, respectively.

Each of the stacked type memory cells M11 to Mmn comprises a series combination of a p-channel enhancement type load transistor Q11, a first memory node N11 and an n-channel enhancement type driver transistor Q12 coupled between a power voltage line Vdd and a ground voltage line GND, a series combination of a p-channel enhancement type load transistor Q13, a second memory node N12 and an n-channel enhancement type driver transistor Q14 coupled between the power voltage line Vdd and the ground voltage line GND, and n-channel enhancement type transfer transistors Q15 and Q16 coupled between the first and second memory nodes N11 and N12 and the associated digit line pair, respectively. The gate electrodes of the p-channel enhancement type load transistor Q11 and the gate electrode of the n-channel enhancement type driver transistor Q14 are coupled with the first memory node N11, and the gate electrodes of the p-channel enhancement type load transistor Q13 and the gate electrode of the n-channel enhancement type driver transistor Q12 are coupled with the second memory node N12. The n-channel enhancement type transfer transistors Q15 and Q16 are gated by the associated word line, and a data bit in the form of differential voltage level is transferred between the associated digit line pair and the pair of memory nodes N11 and N12.

Figure 11:
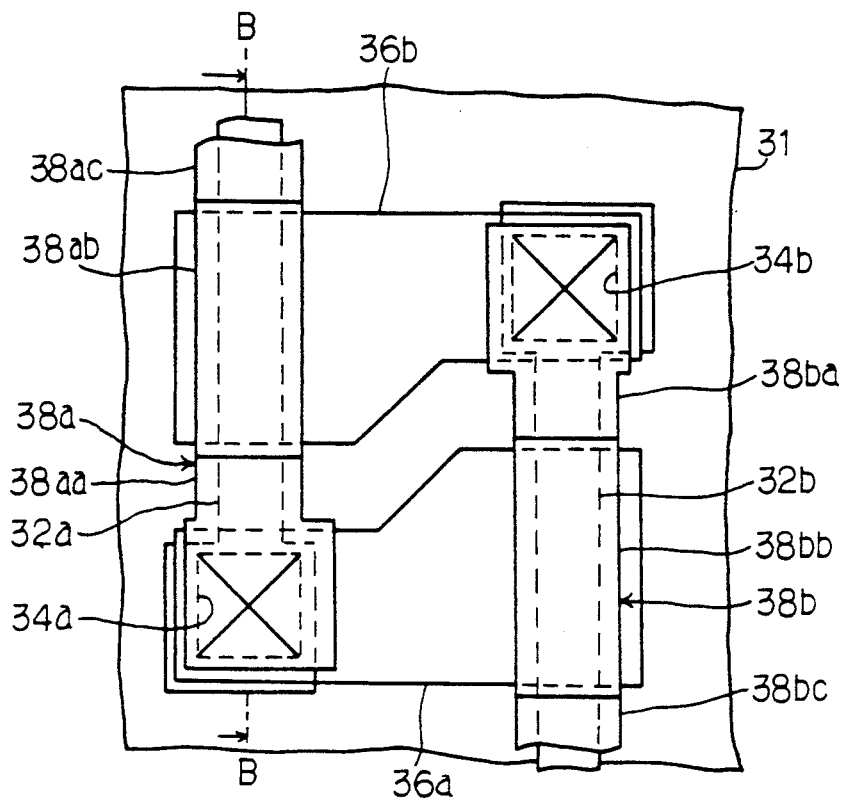
FIG. 11 is a plan view showing the layout of an essential part of a static random access memory cell according to the present invention.
Figure 12:
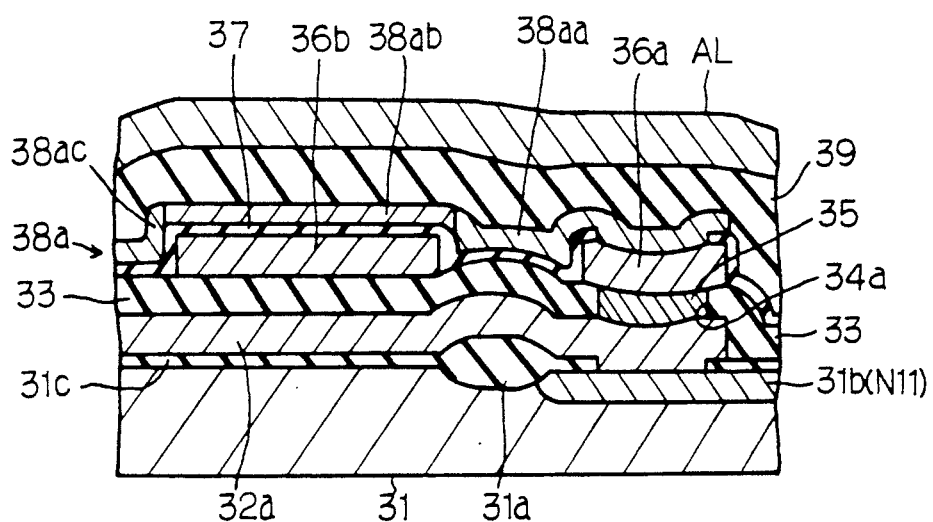
FIG. 12 is a cross sectional view taken along line B—B of FIG. 11 and showing the structure of the static random access memory cell.

An essential part of each stacked type memory cell M11 to Mmn is layouted as shown in FIG. 11, and the structure taken along line B—B is illustrated in FIG. 12. However, inter-level insulating films and an aluminum wiring are deleted from the layout shown in FIG. 11 for the sake of better understanding. Each of the stacked type memory cells M11 to Mmn is fabricated on the p-type silicon substrate 31, and active areas are defined by a thick field oxide film 31a selectively grown on the p-type silicon substrate 31. N-type impurity regions are formed in the active areas of the p-type silicon substrate 31, and the n-type impurity regions serve as source and drain regions of the n-channel enhancement type field effect transistors Q12, Q14, Q15 and Q16. However, only one n-type impurity region 31b is shown in FIG. 12 as a drain region of the n-channel enhancement type driver transistor Q12 or the memory node N11. The active areas are covered with thin gate oxide films 31c, and the gate electrode 32a of the n-channel enhancement type driver transistor Q14 is held in contact with the n-type impurity region 31b or the memory node N11. Similarly, the gate electrode 32b of the n-channel enhancement type driver transistor Q12 is held in contact with the memory node N12.

A first inter-level insulating film 33 covers the gate electrodes 32a and 32b of the n-channel enhancement type driver-transistors Q14 and Q12. Contact holes 34a and 34b are formed in the inter-level insulating film 33, and exposes the gate electrodes 32a and 32b, respectively. Each of the contact holes 34a and 34b is indicated by "X" in FIG. 11. Each of the contact holes 34a and 34b is filled with tungsten, and the tungsten film 35 is as thick as the first inter-level insulating film 33. P-type doped polysilicon strips 36a and 36b are respectively held in contact with the tungsten films 35 in the contact holes 34a and 34b, and serve as the gate electrodes of the p-channel enhancement type load transistors Q11 and Q13, respectively. A thin gate oxide film 37 covers the p-type doped polysilicon strips 36a and 36b, and polysilicon strips 38a and 38b extend over the thin gate oxide film 37. The polysilicon film 38a provides the p-type drain region 38aa, the lightly doped n-type channel region 38ab and the p-type source region 38ac for the p-channel enhancement type load transistor Q11. Similarly, the polysilicon film 38b provides the p-type drain region 38ba, the lightly doped n-type channel region 38bb and the p-type source region 38bc for the p-channel enhancement type load transistor Q13.

A second inter-level insulating film 39 covers the polysilicon strips 38a and 38b, and the aluminum wiring AL extends over the second inter-level insulating film 39.

The multi-layer structure shown in FIGS. 11 and 12 are fabricated through a process sequence shown in FIGS. 13 to 16. The process sequence starts with preparation of the p-type silicon substrate 31, and the thick field oxide film 31a is selectively grown through a selectively oxidation process. Channel doping is carried out through ion-implantation of boron atoms for the n-channel enhancement type field effect transistors Q12, Q14, Q15 and Q16, and silicon oxide is grown to thickness of 5 to 100 nano-meters on the exposed surface of the p-type silicon substrate 31 so as to form the thin gate oxide films 31c. Contact holes 31d are formed in the thin gate oxide films 31c, and tungsten polyside film is deposited to thickness of 200 to 500 nano-meters over the entire surface of the structure. The tungsten polyside film is held in contact through the contact holes 31d, and is etched and patterned to form the gate electrodes 32a and 32b. Arsenic atoms are ion-implanted into the p-type silicon substrate 31 at dose of $10^{15}/cm^2$ to $10^{16}/cm^2$, and is annealed in nitrogen ambience. Then, the source and drain regions 31b are formed in the p-type silicon substrate 31.

Figure 13:
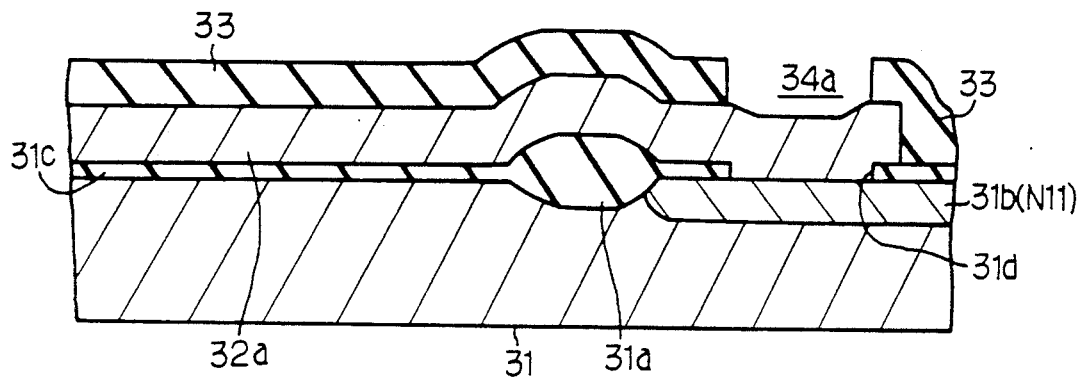
FIGS. 13 to 16 are cross sectional views showing a process sequence for fabricating the static type random access memory cell shown in FIGS. 11 and 12.

Subsequently, silicon dioxide is deposited to thickness of 50 to 500 nano-meters over the entire surface of the structure by using LPCVD process, and the silicon dioxide film thus deposited serves as the inter-level insulating film 33. The contact holes 34a and 34b are formed in the inter-level insulating film 33 through lithographic techniques. The resultant structure of this stage is illustrated in FIG. 13.

Figure 14:
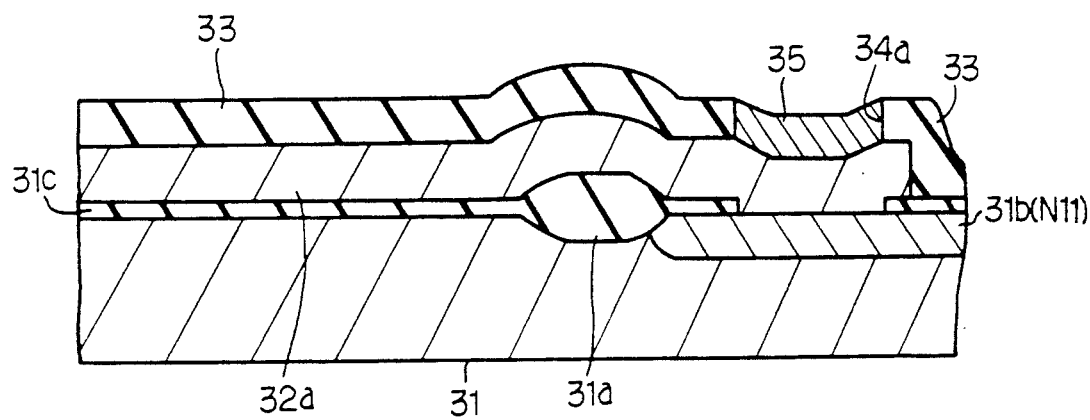
Figure 15:
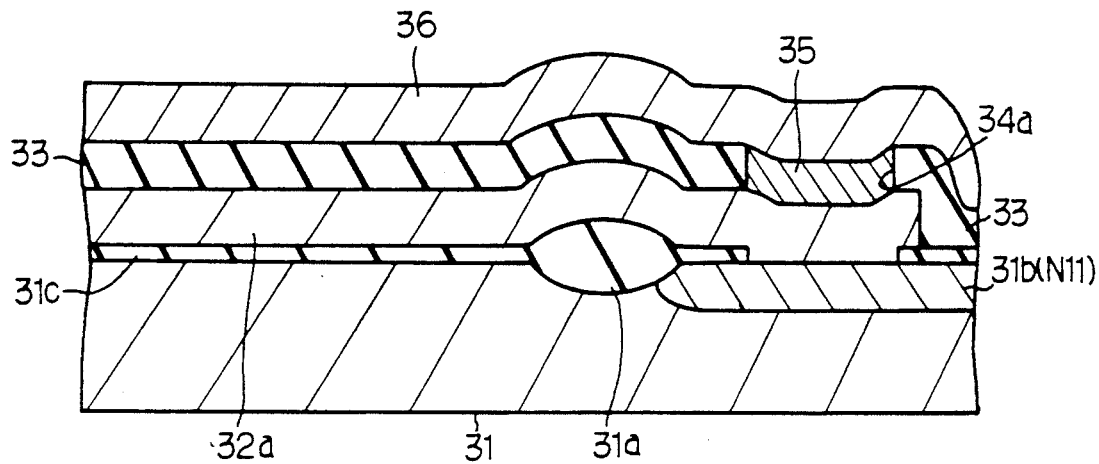

After the formation of the contact holes 34a and 34b in the inter-level insulating film 33, tungsten is selectively grown in the contact holes 34a and 34b by using a selective CVD process, and the tungsten films 35 fill the contact holes 34a and 34b, respectively, as shown in FIG. 14. Polysilicon is deposited to thickness of 100 to 200 nano-meters over the entire surface of the structure by using the LPCVD process, and the polysilicon film 36 thus deposited is held in contact with the tungsten films 35 in the contact holes 34a and 34b. The resultant structure of this stage is illustrated in FIG. 15.

Figure 16:
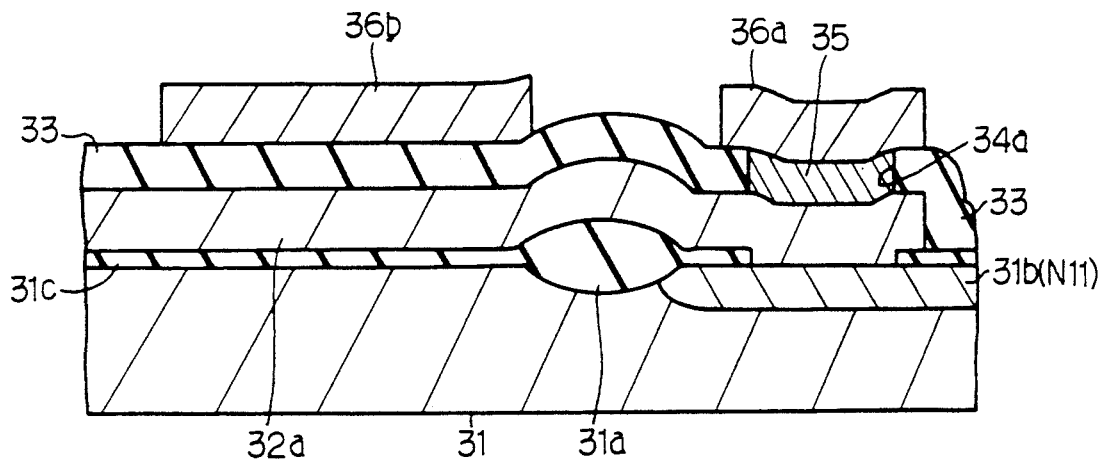

Boron atoms are ion-implanted into the polysilicon film 6 at dose of $10^{19}/cm^2$ to $10^{20}/cm^2$ or, alternatively diffused from an appropriate source, and the p-type polysilicon film 36 heavily doped with the boron atoms is etched and patterned by using lithographic techniques. Then, the p-type polysilicon strips 36a and 36b are left on the inter-level insulating film 33 as shown in FIG. 16.

Silicon oxide is deposited to thickness of 20 to 80 nano-meters over the entire surface of the structure by using the LPCVD process, and the silicon oxide film provides the gate oxide film 37. The gate oxide film 37 is partially removed through lithographic techniques so as to expose parts of the p-type polysilicon strips 36a and 36b. Polysilicon is deposited over the entire surface of the structure again, and the polysilicon film thus deposited is held in contact with the p-type polysilicon strips 36a and 36b.

Phosphorus atoms are ion-implanted into the polysilicon film at dose of $10^{12}/cm^2$ to $10^{13}/cm^2$, and the polysilicon film is patterned into the polysilicon strips 38a and 38b. An appropriate mask layer covering the channel regions 38ab and 38bb is provided on the polysilicon film, and boron atoms are ion-implanted into the polysilicon strips 38a and 38b at dose of $10^{15}/cm^2$ to $10^{16}/cm^2$. Then, the p-type source and drain regions 38aa, 38ba, 38ac and 38bc are formed in the polysilicon strips 38a and 38b, and the p-type drain regions 38aa and 38ba are held in contact with the p-type polysilicon strips 36a and 36b, respectively. Thus, the p-type polysilicon strips 36a and 36b are electrically connected through the tungsten films 35 with the n-type polysilicon strips 32a and 32b, and are directly held in contact with the p-type drain regions 38aa and 38ba. Therefore, any undesirable diode never takes place, and, accordingly, the p-type polysilicon strips 36a and 36b or the gate electrodes of the p-channel enhancement type load transistors Q11 and Q13 do not enter any floating state. On the other hand, the p-type polysilicon strips 36a and 36b are desirable in view of controllability of the threshold and restriction of short channel effect.

After the formation of the source and drain regions, phosphosilicate glass containing phosphorus at 4 mol % is deposited to thickness of 100 to 1000 nano-meters over the entire surface of the structure, and the phosphosilicate glass film serves as the second inter-level insulating film 39. Finally, silicon-containing aluminum is deposited over the entire surface of the structure, and is patterned into the aluminum wiring AL. The resultant structure is previously illustrated in FIGS. 11 and 12.

Second Embodiment

Figure 17:
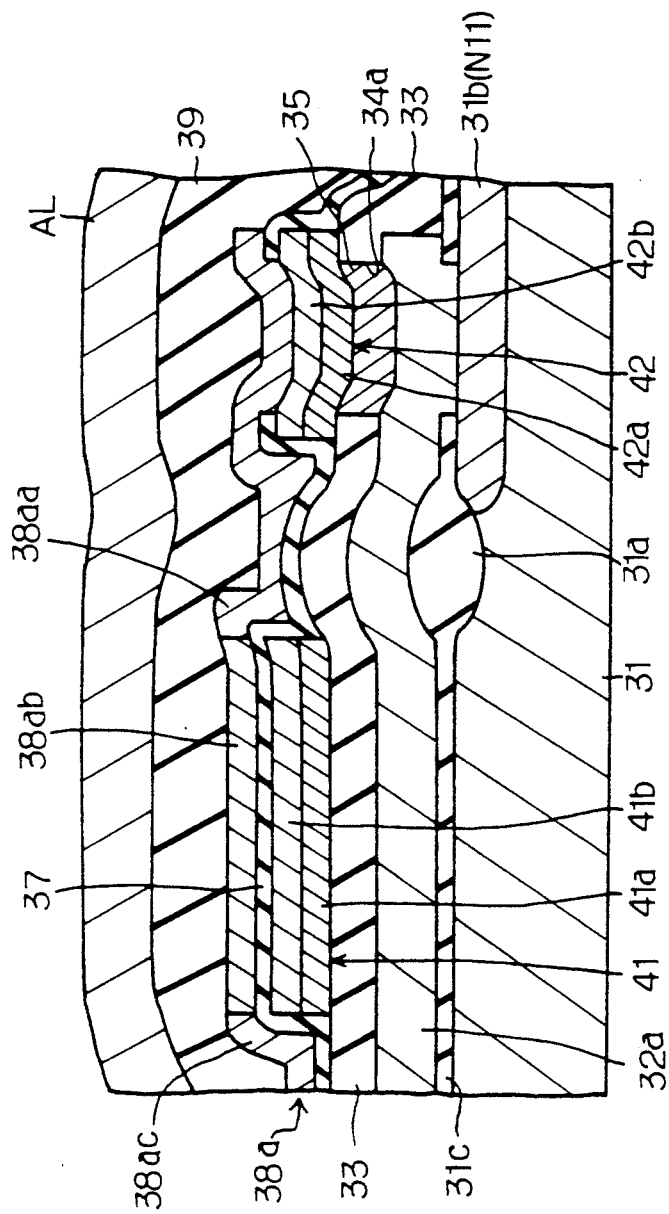
FIG. 17 is a cross sectional view showing the structure of another static random access memory cell according to the present invention.

Turning to FIG. 17 of the drawings, another stacked type memory cell embodying the present invention is illustrated, and is incorporated in a static type random access memory device. The stacked type memory cell implementing the second embodiment is of the six-transistor cell, and is similar to the first embodiment except for the gate electrodes 41 and 42 of the p-channel enhancement type load transistors. For this reason, component films and regions of the second embodiment are labeled with the same references designating the corresponding films and regions of the first embodiment. The gate electrodes of the p-channel enhancement type load transistors are of the polyside structure, i.e., lower refractory metal silicide films 41a and 42a overlain by polysilicon films 41b and 42b, respectively.

Figure 18:
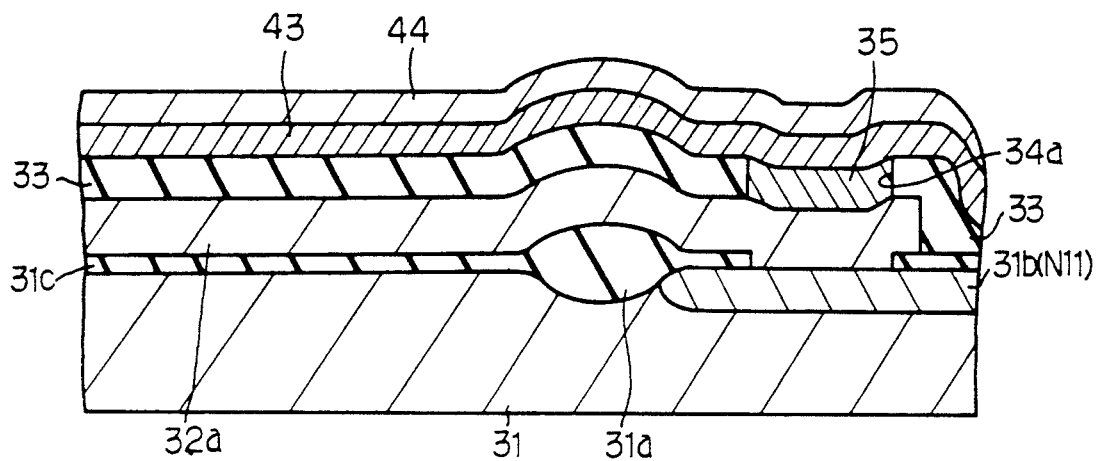
FIGS. 18 and 19 are cross sectional views showing a process sequence for fabricating the static type random access memory cell shown in FIG. 17.

A process sequence of fabricating the structure shown in FIG. 17 is similar to that of the first embodiment until the contact holes 34a and 34b are filled with tungsten. A refractory metal silicide film 43 is sputtered onto the entire surface of the structure to thickness of 50 nano-meters to 100 nano-meters, and is held in contact with the tungsten films 35. After the sputtering, a polysilicon film 44 is deposited to thickness of 50 nano-meters to 100 nano-meters on the refractory metal silicide film 43 by using the LPCVD process as shown in FIG. 18.

Figure 19:
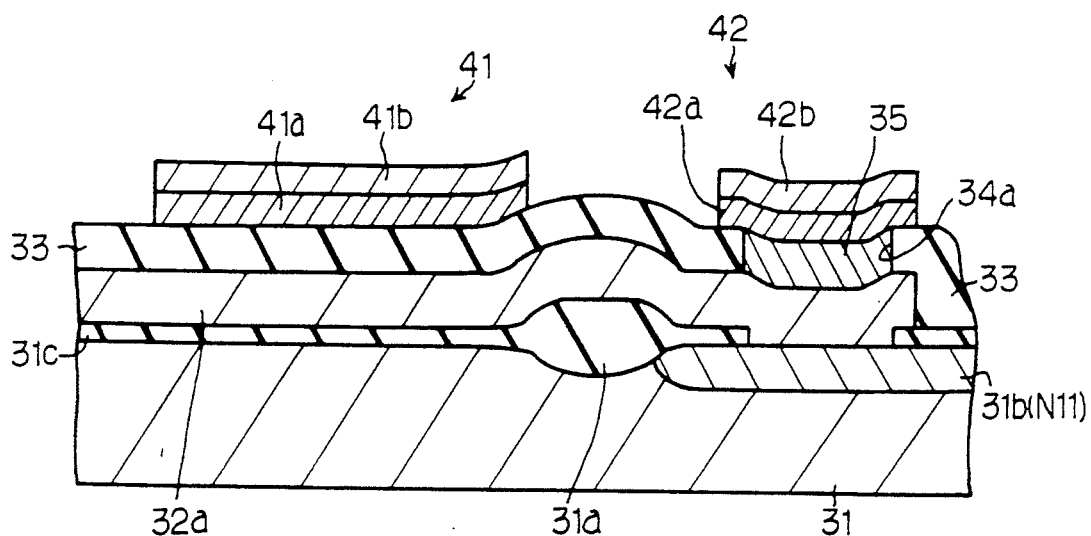

The refractory metal silicide film 43 and the polysilicon film 44 are etched and patterned through lithographic techniques. Since the polysilicon film 43 is subjected to in situ doping or post doping with p-type impurity atoms, the polysilicon films 41b and 42b are of the p-type conductivity type. The resultant structure is illustrated in FIG. 19. After the formation of the gate electrodes 41 and 42, the process sequence for the second embodiment follows that of the first embodiment again.

Although particular embodiments of the present invention have been shown and described, it will be obvious to those skilled in the art that various changes and modifications may be made without departing from the spirit and scope of the present invention. For example, the tungsten films 35 may be replaceable with another conductive metal film in so far as another conductive metal does not serve as dopant. Other refractory metals may be available.

What is claimed is:

1. A static type random access memory device fabricated on a single semiconductor substrate, comprising a plurality of memory cells each having a series combination of a first enhancement type load transistor with a first channel conductivity type, a first memory node and a second enhancement type driver transistor with a second channel conductivity type opposite to said first channel conductivity type coupled between first and second sources of voltage level different in voltage level, a series combination of a third enhancement type load transistor with said first channel conductivity type, a second memory node and a fourth enhancement type driver transistor with said second channel conductivity type coupled between said first and second sources of voltage level, and fifth and sixth enhancement type transfer transistors coupled between said first and second memory nodes and a pair of digit lines, respectively, said first enhancement type load transistor and said fourth enhancement type driver transistor having respective gate electrodes coupled with said first memory node, said third enhancement type load transistor and said second enhancement type driver transistor having respective gate electrodes coupled with said second memory node, the gate electrode of each of said second and fourth enhancement type driver transistors being held in contact with one of said second and first memory nodes formed in a surface portion of said single semiconductor substrate and extending over a first insulating film covering a major surface of said single semiconductor substrate, said gate electrode of said each of said second and fourth enhancement type driver transistors being covered with a first inter-level insulating film having a contact hole exposing a part of said gate electrode of said each of said second and fourth enhancement type driver transistors, said part of said gate electrode being covered with a metal film without dopant impurity, the gate electrode of one of said first and third enhancement type load transistors being held in contact with said metal film and having a first conductivity type opposite to a second conductivity type of said gate electrode of said each of said second and fourth enhancement type driver transistors so that said gate electrode of said one of said first and third enhancement type load transistors being prevented from dopant impurity of said second conductivity type contained in said gate electrode of said each of said second and fourth enhancement type driver transistors, a second insulating film being covered with said gate electrode of said one of said first and third enhancement type load transistors, a semiconductor film extending over said second insulating film for providing a source, a channel and a drain of the other of said first and third enhancement type load transistors, said drain of said other of said first and third enhancement type load transistors being held in contact with said gate electrode of said one of said first and third enhancement type load transistors through a contact hole formed in said second insulating film.

2. A static type random access memory device as set forth in claim 1, in which said gate electrode of said each of said second and fourth enhancement type driver transistors is formed on an n-type polysilicon strip.

3. A static type random access memory device as set forth in claim 1, in which said metal film is formed of tungsten.

4. A static type random access memory device as set forth in claim 2, in which said gate electrode of each of said first and third enhancement type load transistors is formed on a p-type polysilicon strip.

5. A static type random access memory device as set forth in claim 2, in which said gate electrode of each of said first and third enhancement type load transistors having a refractory metal silicide film and a p-type polysilicon strip laminated on said refractory metal silicide film.

6. A static type random access memory device fabricated on a single semiconductor substrate, comprising a plurality of memory cells each having a series combination of a first enhancement type load transistor with a first channel conductivity type, a first memory node and a second enhancement type driver transistor with a second channel conductivity type opposite to said first channel conductivity type coupled between first and second sources of voltage level different in voltage level, a series combination of a third enhancement type load transistor with said first channel conductivity type, a second memory node and a fourth enhancement type driver transistor with said second channel conductivity type coupled between said first and second sources of voltage level, and fifth and sixth enhancement type transfer transistors coupled between said first and second memory nodes and a pair of digit lines, respectively, said first enhancement type load transistor and said fourth enhancement type driver transistor having respective gate electrodes coupled with said first memory node, said third enhancement type load transistor and said second enhancement type driver transistor having respective gate electrodes coupled with said second memory node, the gate electrode of each of said second and fourth enhancement type driver transistors being held in contact with one of said second and first memory nodes formed in a surface portion of said single semiconductor substrate and extending over a first insulating film covering a major surface of said single semiconductor substrate, said gate electrode of said each of said second and fourth enhancement type driver transistors being covered with a first inter-level insulating film having a contact hole exposing a part of said gate electrode of said each of said second and fourth enhancement type driver transistors, said part of said gate electrode being covered with a metal film without dopant impurity, the gate electrode of one of said first and third enhancement type load transistors being held in contact with said metal film and having a first conductivity type opposite to a second conductivity type of said gate electrode of said each of said second and fourth enhancement type driver transistors so that said gate electrode of said one of said first and third enhancement type load transistors being prevented from dopant impurity of said second conductivity type contained in said gate electrode of said each of said second and fourth enhancement type driver transistors, a second insulating film being covered with said gate electrode of said one of said first and third enhancement type load transistors, a semiconductor film extending over said second insulating film for providing a source, a channel and a drain of the other of said first and third enhancement type load transistors, said drain of said other of said first and third enhancement type load transistors being held in contact with said gate electrode of said one of said first and third enhancement type load transistors through a contact hole formed in said second insulating film, said gate electrode of each of said first and third enhancement type load transistors having a refractory metal silicide film and a polysilicon strip laminated on said refractory metal silicide film.

* * * * *

UNITED STATES PATENT AND TRADEMARK OFFICE
CERTIFICATE OF CORRECTION

PATENT NO.   : 5,331,170
DATED        : July 19, 1994
INVENTOR(S)  : Hayashi

It is certified that error(s) appears in the above-identified patent and that said Letters Patent is hereby corrected as shown below:

On the title page, Item [73]:

Assignee: delete "Nec", insert --NEC--.

Signed and Sealed this

Sixth Day of December, 1994

Attest:

BRUCE LEHMAN

*Attesting Officer*    *Commissioner of Patents and Trademarks*